United States Patent
Sakano et al.

(10) Patent No.: US 10,559,479 B2
(45) Date of Patent: Feb. 11, 2020

(54) SEMICONDUCTOR MANUFACTURING APPARATUS AND MANUFACTURING METHOD OF SEMICONDUCTOR DEVICE

(71) Applicant: TOSHIBA MEMORY CORPORATION, Minato-ku (JP)

(72) Inventors: Nozomi Sakano, Nagoya (JP); Daisuke Nishida, Mie (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 16/129,319

(22) Filed: Sep. 12, 2018

(65) Prior Publication Data

US 2019/0267259 A1    Aug. 29, 2019

(30) Foreign Application Priority Data

Feb. 27, 2018  (JP) .................................. 2018-033594
Sep. 7, 2018   (JP) .................................. 2018-168057

(51) Int. Cl.
| | | |
|---|---|---|
| H01L 21/00 | (2006.01) | |
| H01L 21/84 | (2006.01) | |
| H01L 21/67 | (2006.01) | |
| H01L 21/02 | (2006.01) | |
| H01L 21/687 | (2006.01) | |

(52) U.S. Cl.
CPC .. *H01L 21/67017* (2013.01); *H01L 21/02233* (2013.01); *H01L 21/02255* (2013.01); *H01L 21/6719* (2013.01); *H01L 21/67115* (2013.01); *H01L 21/68785* (2013.01)

(58) Field of Classification Search
CPC ......... H01L 21/02233; H01L 21/67017; H01L 21/02532; H01L 21/02592; H01L 27/1274; G06K 9/0002; G06K 9/00087
USPC ......................................................... 438/154
See application file for complete search history.

(56) References Cited

U.S. PATENT DOCUMENTS

| | | | |
|---|---|---|---|
| 5,834,363 A | 11/1998 | Masanori | |
| 9,552,983 B2 | 1/2017 | Hirata et al. | |
| 9,922,858 B2 | 3/2018 | Tachioka et al. | |
| 10,388,524 B2* | 8/2019 | Ueda | H01L 21/31144 |
| 2006/0102210 A1* | 5/2006 | Chouno | H01L 21/67748 |
| | | | 134/148 |
| 2010/0081094 A1* | 4/2010 | Hasebe | C23C 16/02 |
| | | | 430/323 |
| 2016/0233085 A1* | 8/2016 | Yamaguchi | H01L 21/02126 |

(Continued)

FOREIGN PATENT DOCUMENTS

| | | |
|---|---|---|
| JP | 61-206232 | 9/1986 |
| JP | 3344205 | 11/2002 |

(Continued)

*Primary Examiner* — David S Blum

(74) *Attorney, Agent, or Firm* — Oblon, McClelland, Maier & Neustadt, L.L.P.

(57) ABSTRACT

A semiconductor manufacturing apparatus according to an embodiment comprises: a lid member; a support member; an oxidation resistant member; and an oxidizing system gas introducing member. The lid member is opposed to a surface of a semiconductor substrate. The support member supports the lid member. The oxidation resistant member is opposed to a back of the semiconductor substrate. The oxidizing system gas introducing member introduces an oxidizing system gas that oxidizes the back of the semiconductor substrate.

16 Claims, 4 Drawing Sheets

(56) References Cited

U.S. PATENT DOCUMENTS

| | | | |
|---|---|---|---|
| 2017/0178889 A1* | 6/2017 | Yamakoshi | ............. C23C 16/34 |
| 2018/0087184 A1 | 3/2018 | Nonaka et al. | |
| 2018/0337031 A1* | 11/2018 | Hashimoto | ........... H01L 21/022 |

FOREIGN PATENT DOCUMENTS

| | | |
|---|---|---|
| JP | 5271648 | 8/2013 |
| JP | 5610328 | 10/2014 |
| JP | 2015-207733 | 11/2015 |
| JP | 2016-213232 | 12/2016 |

* cited by examiner

SEMICONDUCTOR MANUFACTURING APPARATUS AND MANUFACTURING METHOD OF SEMICONDUCTOR DEVICE

CROSS-REFERENCE TO RELATED APPLICATIONS

This application is based upon and claims the benefit of priority from Japanese Patent Applications No. 2018-033594, filed on Feb. 27, 2018, and No. 2018-168057, filed on Sep. 7, 2018; the entire contents of which are incorporated herein by reference.

FIELD

The embodiments of the present invention relate to a semiconductor manufacturing apparatus and a manufacturing method of a semiconductor device.

BACKGROUND

As a type of semiconductor manufacturing apparatus, there is a heat treatment device that oxidizes a surface of a semiconductor substrate. At the time of oxidation, when only the surface of the semiconductor substrate is oxidized, the surface side of the semiconductor substrate becomes thick. As a result, there is a concern that warpage of the semiconductor substrate becomes large.

An embodiment of the present invention provides a semiconductor manufacturing apparatus and a manufacturing method of a semiconductor device that can suppress warpage of a semiconductor substrate.

DETAILED DESCRIPTION

Embodiments will now be explained with reference to the accompanying drawings. The present invention is not limited to the embodiments.

First Embodiment

Figure 1:
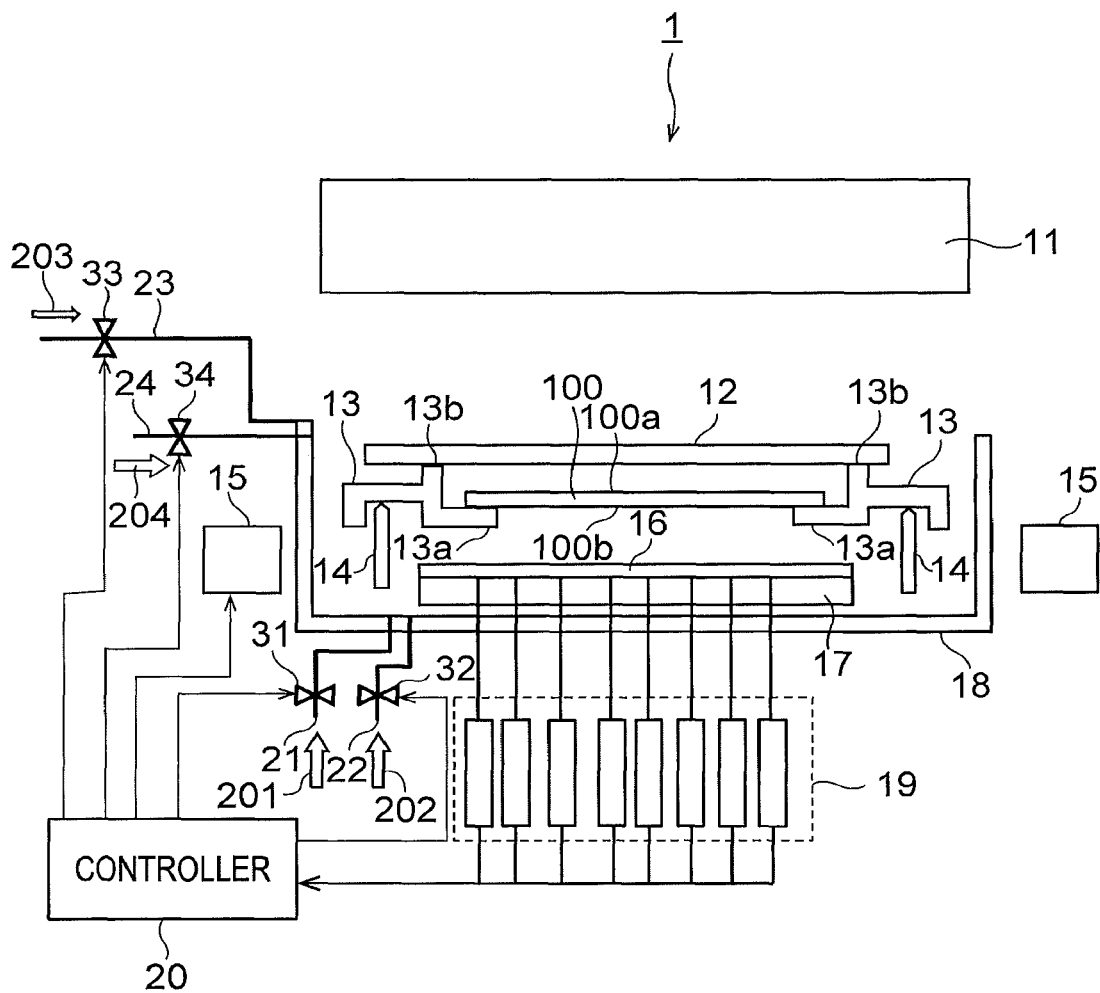
FIG. 1 is a schematic diagram illustrating a configuration of a semiconductor manufacturing apparatus according to an embodiment.

FIG. 1 is a schematic diagram illustrating a configuration of a semiconductor manufacturing apparatus according to a first embodiment. A semiconductor manufacturing apparatus 1 illustrated in FIG. 1 is a single-wafer heat treatment device for oxidizing a surface 100a and a back 100b of a semiconductor substrate 100. Specifically, the semiconductor manufacturing apparatus 1 includes a heat source 11, a lid member 12, a support member 13, a rotating body 14, a driving mechanism 15, an oxidation resistant member 16, a reflecting plate 17, a chamber 18, a thermometer 19, a controller 20, gas introducing members 21 to 24, and valves 31 to 34.

The heat source 11 applies heat to the semiconductor substrate 100. In the present embodiment, the heat source 11 is a light source that radiates lamp light towards the semiconductor substrate 100. However, the heat source 11 is not limited to a light source, but can be a heating element, for example.

The lid member 12 is opposed to the surface 100a of the semiconductor substrate 100. In other words, the lid member 12 is located between the heat source 11 and the semiconductor substrate 100. The lid member 12 is a member for preventing oxidation of the surface 100a when the back 100b is oxidized. Therefore, the plane area of the lid member 12 is larger than the plane area of the semiconductor substrate 100. In a case where the heat source 11 is a light source, the lid member 12 is a light transmitting member that allows light of the light source to pass therethrough.

The support member 13 includes a lower end portion 13a that supports the semiconductor substrate 100 and an upper end portion 13b that supports the lid member 12. The planar shape of the lower end portion 13a and the upper end portion 13b is annular, for example. In this case, the opening diameter of the upper end portion 13b is larger than the opening diameter of the lower end portion 13a.

The rotating body 14 is attached to the support member 13. When the driving mechanism 15 rotates and moves the rotating body 14 based on control by the controller 20, the rotating force of the rotating body 14 is transmitted to the semiconductor substrate 100 and the lid member 12 via the support member 13. With this configuration, the semiconductor substrate 100 and the lid member 12 are rotated. In the present embodiment, the driving mechanism 15 generates a magnetic force to drive the rotating body 14. However, the principle of driving the rotating body 14 can be another type of force other than a magnetic force, such as a gas.

The oxidation resistant member 16 is opposed to the back 100b of the semiconductor substrate 100. The oxidation resistant member 16 contains quartz or chrome (Cr), for example. In the present embodiment, the oxidation resistant member 16 is provided on the reflecting plate 17. Therefore, oxidation of the reflecting plate 17 can be avoided when the back 100b is oxidized.

The reflecting plate 17 reflects light radiated from the heat source 11 as a light source towards the semiconductor substrate 100. Therefore, it is possible to efficiently use the light of the light source for heating the semiconductor substrate 100. A member covered by the oxidation resistant member 16 on the back 100b of the semiconductor substrate 100 is not limited to the reflecting plate 17, but can be a heat source such as a lamp or a heating wire. Also in this case, it is possible to efficiently heat the semiconductor substrate 100.

The chamber 18 accommodates therein the lid member 12, the support member 13, the rotating body 14, the driving mechanism 15, the oxidation resistant member 16, and the reflecting plate 17 therein. The thermometer 19 measures the temperature of the reflecting plate 17 and outputs the measurement result to the controller 20. Although a plurality of thermometers 19 are used in the present embodiment, the number of the thermometers 19 is not specifically limited to any number. The controller 20 performs various control operations.

The gas introducing member 21 (oxidizing system gas introducing member) introduces an oxidizing system gas 201 into the chamber 18. The oxidizing system gas 201 flows between the back 100b of the semiconductor substrate 100 and the oxidation resistant member 16. Therefore, the back 100b is oxidized. The valve 31 is attached to the gas introducing member 21. The oxidizing system gas 201 contains oxidizing species such as oxygen (O2), water vapor, oxygen radical (O), or hydroxyl radical (HO). Oxygen radical and hydroxyl radical can be generated in the chamber 18 or outside the chamber 18.

The gas introducing member 22 introduces an inert gas 202 into the chamber 18. The inert gas 202 also flows between the back 100b of the semiconductor substrate 100 and the oxidation resistant member 16. The inert gas 202 is introduced for preventing oxidation of the back 100b of the semiconductor substrate 100 at the time of oxidizing the surface 100a. As the inert gas 202, for example, nitrogen can be applied.

The gas introducing member 23 (inert-gas introducing member) introduces an inert gas 203 into the chamber 18. The inert gas 203 flows between the heat source 11 and the lid member 12. The inert gas 203 is introduced to prevent oxidation of the surface 100a of the semiconductor substrate 100 at the time of oxidizing the back 100b. As the inert gas 203, for example, nitrogen can be applied.

The gas introducing member 24 introduces an oxidizing system gas 204 into the chamber 18. The oxidizing system gas 204 flows on the surface 100a of the semiconductor substrate 100. With this configuration, the surface 100a is oxidized. Similarly to the oxidizing system gas 201, the oxidizing system gas 204 also contains oxidizing species such as oxygen, water vapor, oxygen radical, or hydroxyl radical. Further, oxygen radical and hydroxyl radical can be generated in the chamber 18 or outside the chamber 18.

The valves 31 to 34 are provided in the respective gas introducing members described above. Each of the valves is opened and closed based on control by the controller 20. Introduction of each gas is controlled by an opening/closing operation of each valve.

Figure 2:
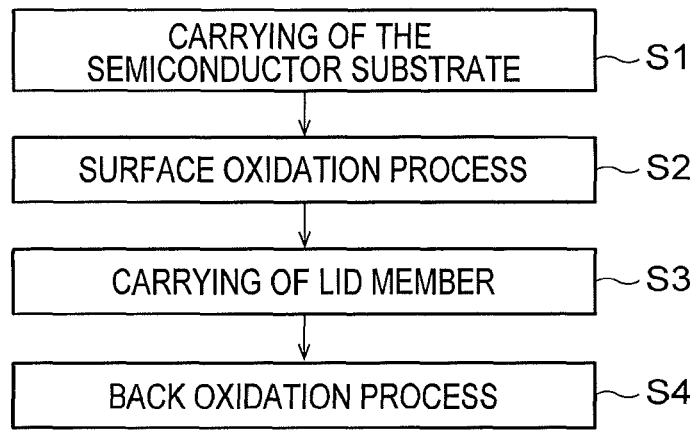
FIG. 2 is a flowchart of heat treatment of the semiconductor manufacturing apparatus according to the embodiment.

FIG. 2 is a flowchart of heat treatment of the semiconductor manufacturing apparatus 1 according to the present embodiment. First, the semiconductor substrate 100 is carried into the chamber 18 (Step S1). Here, Step S1 is described with reference to FIG. 3.

Figure 3:
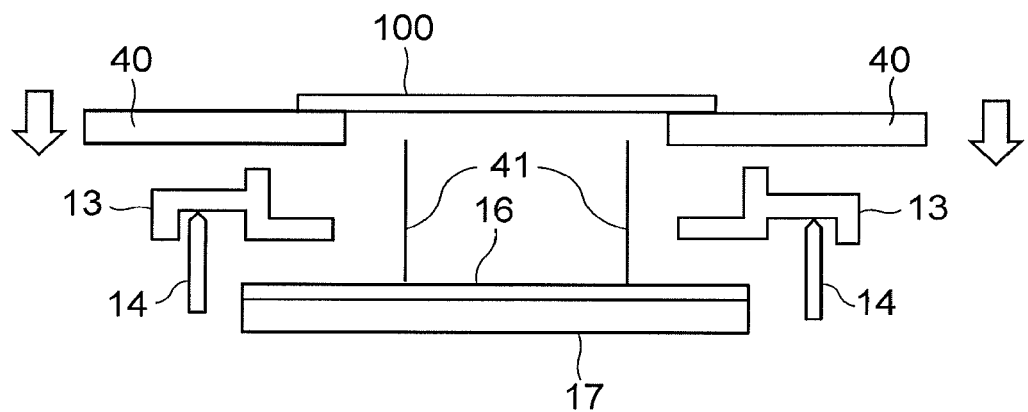
FIG. 3 is a schematic diagram illustrating an example of a method of carrying a semiconductor substrate.

FIG. 3 is a schematic diagram illustrating an example of a method of carrying the semiconductor substrate 100. In the present embodiment, a transfer arm 40 moves down while holding the semiconductor substrate 100. At this time, a lift pin 41 projects from the oxidation resistant member 16. A tip of the lift pin 41 is at a position higher than the support member 13. The transfer arm 40 moves down to a position at which the lift pin 41 comes into contact with the semiconductor substrate 100. The lift pin 41 then moves down or is shortened because of the own weight of the semiconductor substrate 100. As a result, the semiconductor substrate 100 is supported by the lower end portion 13a of the support member 13. The method of carrying the semiconductor substrate 100 is not limited to the method described above.

Next, a surface oxidation process of oxidizing the surface 100a of the semiconductor substrate 100 is performed (Step S2). At Step S2, the temperature of the reflecting plate 17 rises due to the heat of the heat source 11. This temperature is measured by the thermometer 19 and is input to the controller 20. When the temperature measured by the thermometer 19 reaches a predetermined value, the controller 20 opens the valves 32 and 34. Therefore, the oxidizing system gas 204 is introduced from the gas introducing member 24 into the chamber 18, so that the surface 100a of the semiconductor substrate 100 is oxidized. At this time, the inert gas 202 is also introduced from the gas introducing member 22 into the chamber 18 and therefore oxidation of the back 100b of the semiconductor substrate 100 can be avoided.

Next, the lid member 12 is carried into the chamber 18 (Step S3). Here, Step S3 is described with reference to FIGS. 4 and 5.

Figure 4:
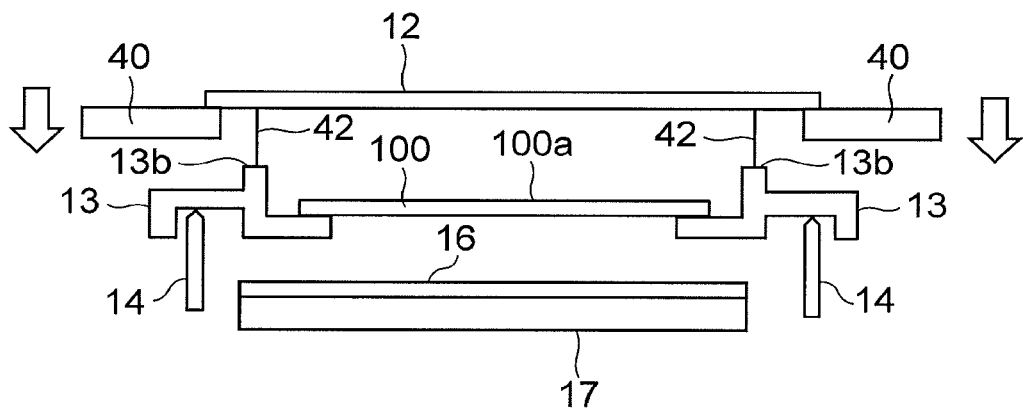
FIG. 4 is a schematic diagram illustrating an example of a method of carrying a lid member.
Figure 5:
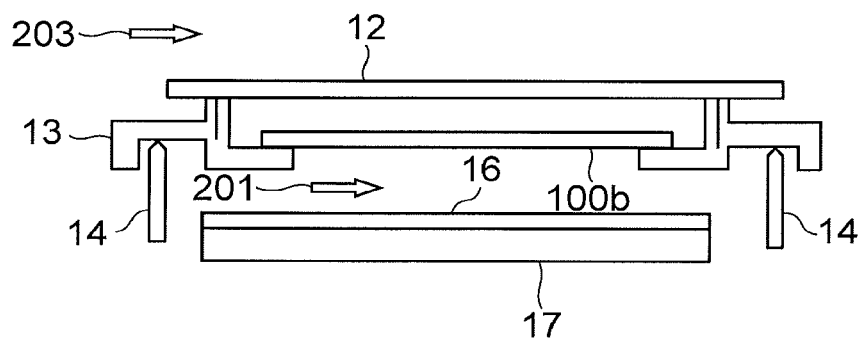
FIG. 5 is a schematic diagram illustrating an example of the method of carrying a lid member.

FIGS. 4 and 5 are schematic diagrams illustrating an example of a method of carrying the lid member 12. In the present embodiment, as illustrated in FIG. 4, the transfer arm 40 moves down while holding the lid member 12. At this time, a lift pin 42 projects from the upper end portion 13b of the support member 13. The transfer arm 40 moves down to a position at which the lift pin 42 comes into contact with the lift member 12. The lift pin 42 then moves down or is shortened because of the own weight of the lid member 12. As a result, as illustrated in FIG. 5, the lid member 12 is supported by the upper end portion 13b of the support member 13. The method of carrying the lid member 12 is not limited to the method described above.

Next, a back oxidation process of oxidizing the back 100b of the semiconductor substrate 100 is performed (Step S4). At Step S4, similarly to Step S2, when the temperature measured by the thermometer 19 reaches a predetermined value, the controller 20 opens the valves 31 and 33. With this configuration, the oxidizing system gas 201 is introduced from the gas introducing member 21 into the chamber 18, so that the back 100b of the semiconductor substrate 100 is oxidized. At this time, the surface 100a of the semiconductor substrate 100 is covered by the lid member 12. Further, the inert gas 203 flows on the lid member 12. Therefore, oxidation of the surface 100a of the semiconductor substrate 100 can be avoided.

According to the present embodiment described above, it is possible to oxidize not only the surface 100a of the semiconductor substrate 100 but also the back 100b. Therefore, it is possible to suppress warpage of the semiconductor substrate 100.

Further, in the present embodiment, oxidation of the surface 100a and the back 100b is achieved by a single semiconductor manufacturing apparatus 1. Therefore, it is not necessary to carry the semiconductor substrate 100 out of a device when the back 100b of the semiconductor substrate 100 is oxidized. Accordingly, the processing time can be shortened. In addition, it is also possible to avoid occurrence of problems such as adherence of foreign objects to the semiconductor substrate 100.

Furthermore, in the present embodiment, alteration to a conventional heat treatment device can be minimized to addition of the lid member 12 and the oxidation resistant member 16. Accordingly, increase of the device size can be suppressed.

Second Embodiment

Figure 6:
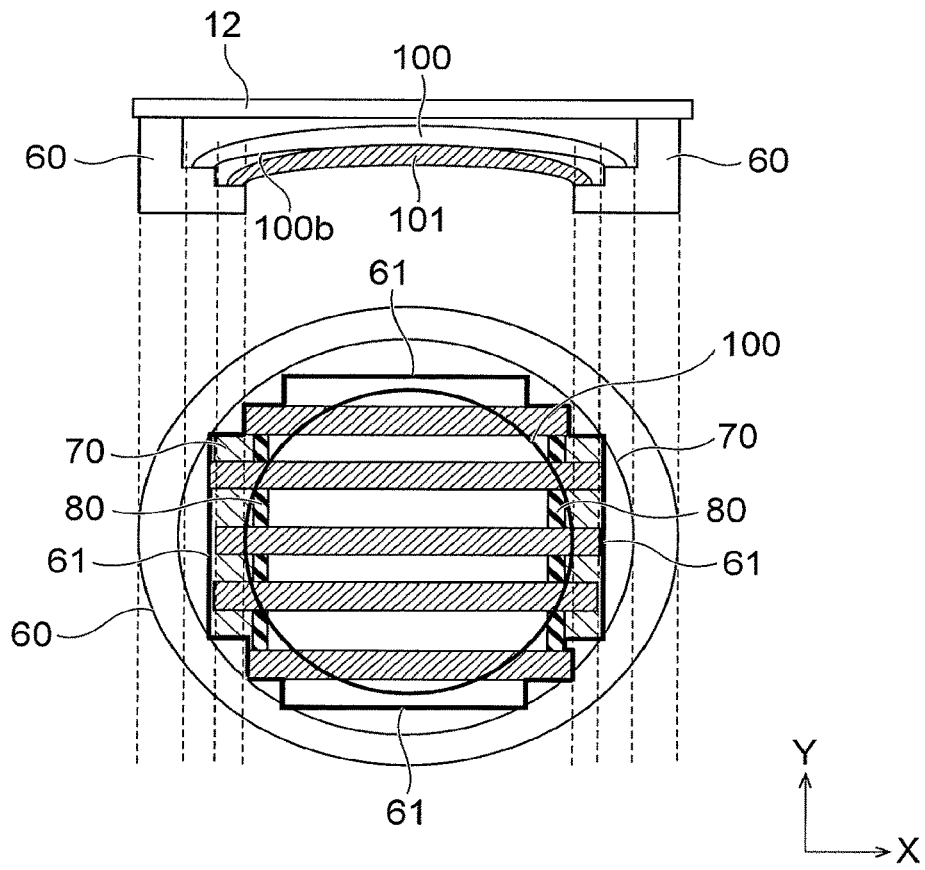
FIG. 6 is a side view and a plan view illustrating a configuration of relevant parts of a semiconductor manufacturing apparatus according to a second embodiment.

FIG. 6 is a side view and a plan view illustrating a configuration of relevant parts of a semiconductor manufacturing apparatus according to a second embodiment. In the plan view, illustrations of the lid member 12 are omitted. In the following descriptions, differences between the first embodiment and the second embodiment are mainly described.

As illustrated in FIG. 6, the lid member 12 is supported by an upper-level portion of a support member 60 in the present embodiment. Further, the semiconductor substrate 100 is supported by a middle-level portion of the support member 60. In addition, a groove 61 is formed in a lower-level portion of the support member 60. In the groove 61, a plurality of masks 101 are supported while being in contact with the back 100b of the semiconductor substrate 100.

In the present embodiment, the masks 101 extend in an X-direction to spread over an opening provided at a center of the support member 60 that is annular. Also, the masks 101 are arranged to be spaced from each other in a Y-direction. The X-direction and the Y-direction are two directions that are in-plane directions parallel to the back 100b of the semiconductor substrate 100 and are perpendicular to each other.

For example, each mask 101 is formed of a heat-resistant material such as quartz. Each mask 101 is used when a back oxidation process of oxidizing the back 100b of the semiconductor substrate 100 is performed. In a case where a temperature condition for the back oxidation process is not a high temperature, the material of each mask 101 does not need to be a heat-resistant material.

When the back oxidation process is performed, a portion of the back 100b that is in contact with the mask 101 is not oxidized, but a portion of the back 100b that is not in contact with the mask 101 is oxidized. Therefore, when the semiconductor substrate 100 is convex upward as illustrated in FIG. 6, for example, the amount of oxidation of the back 100b can be controlled with regard to the X-direction and the Y-direction by partially oxidizing the back 100b by using the masks 101. Accordingly, it is possible to reduce the difference of the amount of warpage between the X-direction and the Y-direction.

Figure 7A:
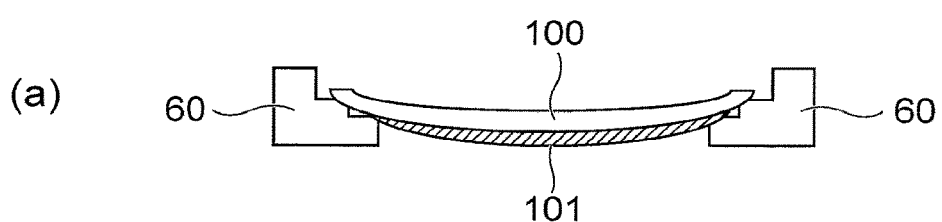
FIG. 7A is a side view illustrating a modification of a mask.
Figure 7B:
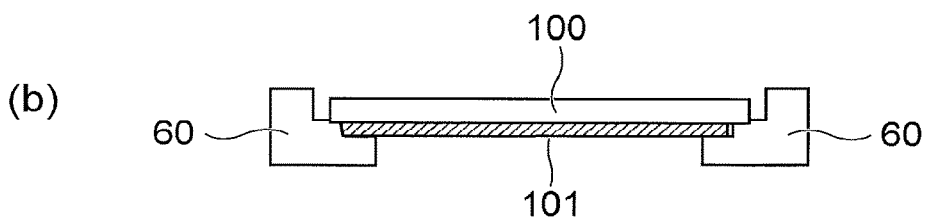
FIG. 7B is a side view illustrating another modification of a mask.

In order to further reduce the difference of the amount of warpage described above, it is desirable that the convex shape of the mask 101 matches the shape of the substrate 100 before being subjected to the back oxidation process. That is, in a case where the convex shape of the semiconductor substrate 100 before being subjected to the back oxidation process is convex upward, as illustrated in FIG. 6, it is desirable that the convex shape of the mask 101 is also convex upward. On the other hand, in a case where the shape of the semiconductor substrate 100 is convex downward, as illustrated in FIG. 7A, it is desirable that the convex shape of the mask 101 is also convex downward. In a case where the shape of the semiconductor substrate 100 is flat, as illustrated in FIG. 7B, it is desirable that the shape of the mask 101 is also flat.

In the present embodiment, the masks 101 are placed in the groove 61 to be spaced from each other. In this case, if each mask 101 is not fixed to the groove 61, it can freely move in the Y-direction and therefore it may move out of place.

Therefore, in the present embodiment, a spacer 70 is provided between the masks 101 in the groove 61. The spacer 70 is a block of a rectangular prism or a cube, for example. Further, in the present embodiment, a fixing table 80 that fixes each mask 101 thereto is provided. The structure of the fixing table 80 is described here with reference to FIG. 8.

Figure 8:
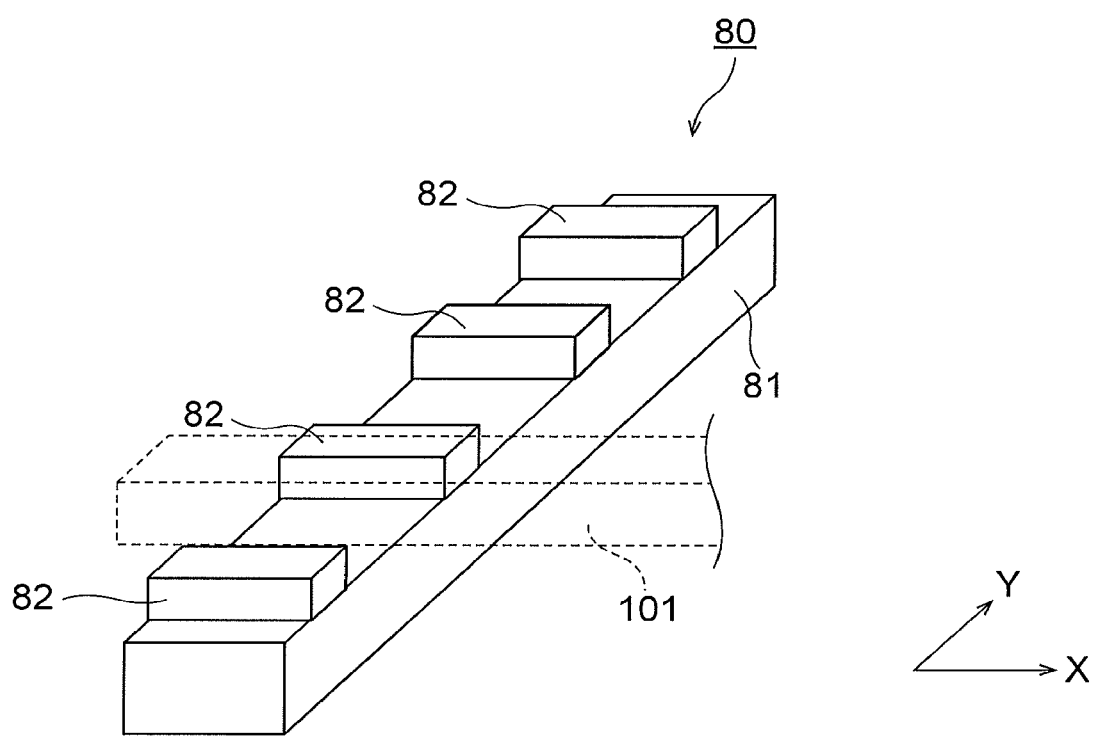
FIG. 8 is a perspective view illustrating a configuration of relevant parts of a fixing table.

FIG. 8 is a perspective view illustrating a configuration of relevant parts of the fixing table 80. The fixing table 80 illustrated in FIG. 8 has a pedestal 81 and a plurality of stoppers 82. The mask 101 is placed on the pedestal 81. The stoppers 82 are provided to be spaced from each other in the Y-direction on the pedestal 81. The mask 101 is arranged between the stoppers 82.

Y-direction movement of the mask 101 is restricted by the spacer 70 described above and the fixing table 80. Accordingly, it is possible to prevent the mask 101 from moving out of place. In a case where fixing of the mask 101 is ensured, it is not necessary to provide both the spacer 70 and the fixing table 80, and it is permissible that only one of them is provided.

Also in the present embodiment described above, similarly to the first embodiment, it is possible to oxidize not only the surface 100a of the semiconductor substrate 100 but also the back 100b. Therefore, it is possible to suppress warpage caused by the thickness difference between the surface 100a and the back 100b. Further, in the present embodiment, a back oxidation process is performed while the mask 101 is in partial contact with the back 100b of the semiconductor substrate 100. Accordingly, it is also possible to reduce the difference of the amount of warpage between in-plane directions of the semiconductor substrate 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A semiconductor manufacturing apparatus comprising:
a lid member opposed to a surface of a semiconductor substrate;
a support member supporting the lid member;
an oxidation resistant member opposed to a back of the semiconductor substrate; and
an oxidizing system gas introducing member introducing an oxidizing system gas that oxidizes the back of the semiconductor substrate.
2. The semiconductor manufacturing apparatus of claim 1, wherein the oxidation resistant member includes quartz or chrome.
3. The semiconductor manufacturing apparatus of claim 1, further comprising a light source heating the semiconductor substrate from above the lid member, wherein
the lid member is a light transmitting member.
4. The semiconductor manufacturing apparatus of claim 3, further comprising a reflecting plate reflecting light from the light source, wherein
the oxidation resistant member is on the reflecting member.
5. The semiconductor manufacturing apparatus of claim 1, wherein the support member has an upper end portion supporting the lid member and a lower end portion supporting the semiconductor substrate.
6. The semiconductor manufacturing apparatus of claim 5, further comprising a rotating body rotating the semiconductor substrate and the lid member via the support member.
7. The semiconductor manufacturing apparatus of claim 1, wherein the support member includes a groove supporting a mask that is in partial contact with the back of the semiconductor substrate.

8. The semiconductor manufacturing apparatus of claim 7, wherein a plurality of the masks are supported by the groove in such a manner that the masks are spaced from each other, and the device further comprises at least one of a spacer arranged between the masks in the groove and a fixing table fixing the masks.

9. The semiconductor manufacturing apparatus of claim 1, further comprising an inert-gas introducing member introducing an inert gas to between the heat source and the lid member.

10. The semiconductor manufacturing apparatus of claim 1, further comprising a heating element heating the semiconductor substrate from above the lid member.

11. The semiconductor manufacturing apparatus of claim 1, wherein a plane area of the lid member is larger than that of the semiconductor substrate.

12. The semiconductor manufacturing apparatus of claim 5, wherein a planar shape of the upper end portion and the lower end portion is annular, and an opening diameter of the upper end portion is larger than that of the lower end portion.

13. The semiconductor manufacturing apparatus of claim 6, wherein the rotating body is rotated by a magnetic force or a gas.

14. The semiconductor manufacturing apparatus of claim 1, further comprising:

a valve in the oxidizing system gas introducing member; and a controller controlling an opening/closing operation of the valve.

15. A manufacturing method of a semiconductor device comprising:

supporting a lid member opposed to a surface of a semiconductor substrate by a support member;

arranging an oxidation resistant member opposed to a back of the semiconductor substrate;

supporting a mask that is in partial contact with the back by a groove provided in the support member; and introducing an oxidizing system gas to between the back and the oxidation resistant member in order to oxidize a portion of the back that is not in contact with the mask.

16. The method of claim 15, wherein a convex shape of the semiconductor substrate before oxidation of the back is performed matches a convex shape of the mask.

* * * * *